(12) United States Patent
Vitikkate et al.

(10) Patent No.: US 8,810,971 B1
(45) Date of Patent: Aug. 19, 2014

(54) SINGLE SHEET DIFFERENTIAL-POLED PIEZOELECTRIC MICROACTUATOR FOR A HARD DISK DRIVE

(71) Applicant: HGST Netherlands B.V., Amsterdam (NL)

(72) Inventors: Vipin Ayanoor Vitikkate, Palakkad-Kerala (IN); Toshiki Hirano, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/858,716

(22) Filed: Apr. 8, 2013

(51) Int. Cl.
*G11B 21/24* (2006.01)

(52) U.S. Cl.
USPC ...................................... 360/294.4

(58) Field of Classification Search
USPC ...................................... 360/294.4
See application file for complete search history.

(56) References Cited

U.S. PATENT DOCUMENTS

| | | | |
|---|---|---|---|
| 5,943,189 A | 8/1999 | Boutaghou et al. | |
| 6,005,742 A | 12/1999 | Cunningham et al. | |
| 6,108,175 A * | 8/2000 | Hawwa et al. | 360/294.4 |
| 6,246,552 B1 | 6/2001 | Soeno et al. | |
| 6,289,564 B1 | 9/2001 | Novotny | |
| 6,404,599 B1 | 6/2002 | Vigna | |
| 6,653,763 B2 * | 11/2003 | Wang et al. | 310/369 |
| 6,680,826 B2 * | 1/2004 | Shiraishi et al. | 360/294.4 |
| 6,683,757 B1 | 1/2004 | Bonin et al. | |
| 6,738,231 B2 | 5/2004 | Arya et al. | |
| 6,807,030 B1 * | 10/2004 | Hawwa et al. | 360/294.4 |
| 6,859,345 B2 * | 2/2005 | Boutaghou et al. | 360/294.4 |
| 6,870,709 B2 | 3/2005 | Shimanouchi et al. | |
| 6,870,710 B2 | 3/2005 | Hida et al. | |
| 7,068,473 B2 * | 6/2006 | O'Neill | 360/294.4 |
| 7,110,224 B2 | 9/2006 | Nakamura et al. | |
| 7,471,490 B2 | 12/2008 | Yao | |
| 7,558,026 B2 | 7/2009 | Kwon et al. | |
| 8,040,639 B2 | 10/2011 | Juang et al. | |
| 8,213,128 B2 | 7/2012 | Soga et al. | |

OTHER PUBLICATIONS

Koganezawa, S. et al., "Dual-Stage Actuator System for Magnetic Disk Drives Using a Shear Mode Piezoelectric Microactuator", IEEE Transactions on Magnetics, vol. 35, No. 2, Mar. 1999, 5 pages.

Soeno, Yoshikazu, et al., "Piezoelectric Piggy-Back Microactuator for Hard Disk Drive", Advanced Products Development Center, TDK Corporation, Japan, Apr. 14, 1998, 5 pages.

(Continued)

*Primary Examiner* — Mark Blouin

(74) *Attorney, Agent, or Firm* — John D. Henkhaus

(57) ABSTRACT

A piezoelectric (PZT) microactuator directly attached to a head slider, for mounting on a suspension for use as a third stage actuator in a hard disk drive, is fabricated from and comprises a single sheet of a piezoelectric material with the top and bottom covered with an electrically conductive material to form the electrodes. The piezoelectric material is differential-poled so that one lateral portion is poled in one direction and another lateral portion is poled in the opposite direction. When a drive voltage is applied between the top and bottom electrodes, one portion of the piezoelectric material expands while the other portion contracts, thereby providing a rotational movement. The direction of motion of each respective portion is determined by the direction of the applied voltage and the respective direction of poling.

11 Claims, 6 Drawing Sheets

(56) References Cited

OTHER PUBLICATIONS

Han, Younghee, "A New Piezoelectric Microactuator with Transverse and Lateral Control of Head Positioning Systems for High Density Hard Disk Drives", University of Kentucky UKnowledge Dec. 15, 2005, 128 pages.

Imamura, Takahiro, et al., "Transverse Mode Electrostatic Microactuator for MEMS-Based HDD Slider", IEEE, 1996, 6 pages.

\* cited by examiner

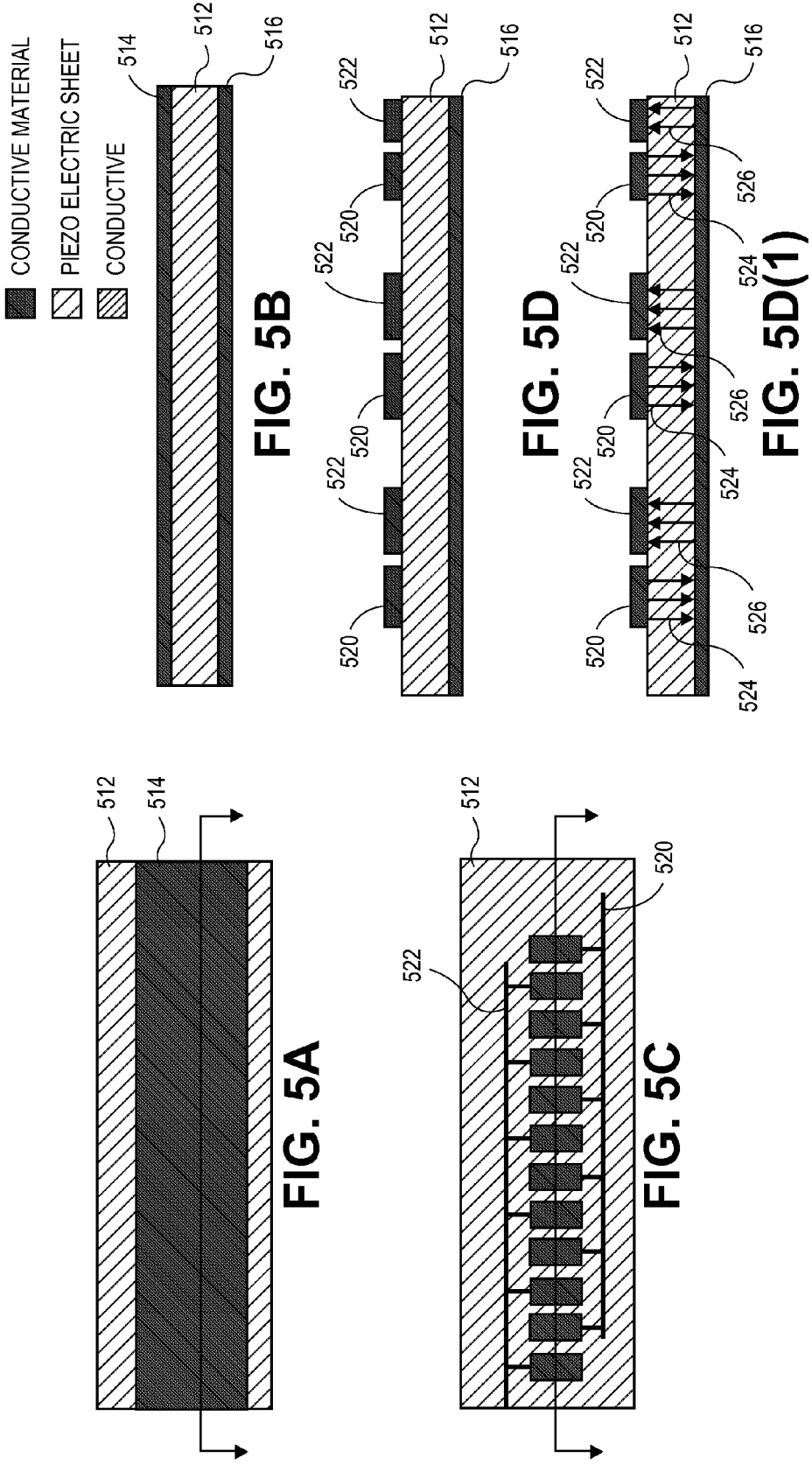

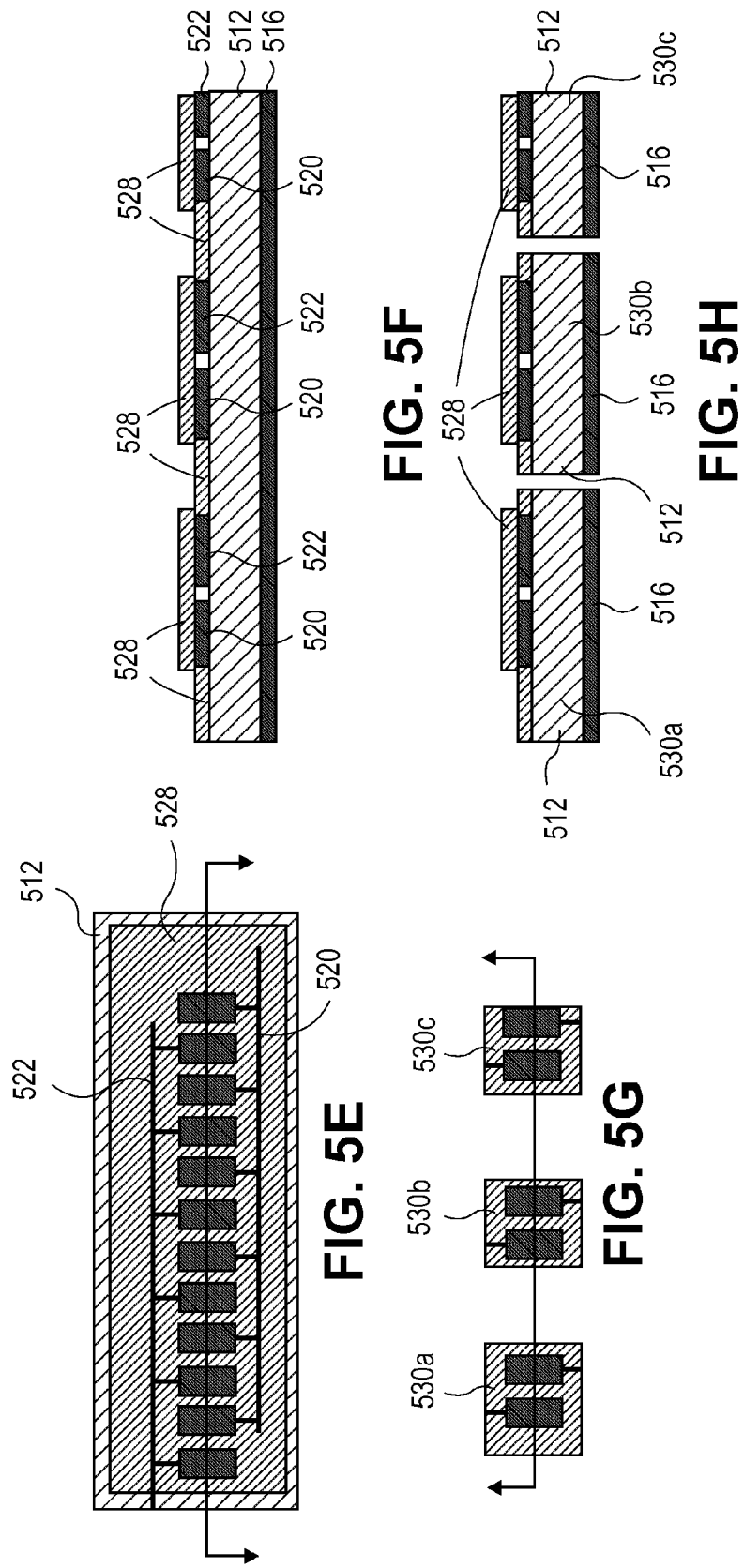

SINGLE SHEET DIFFERENTIAL-POLED PIEZOELECTRIC MICROACTUATOR FOR A HARD DISK DRIVE

FIELD OF EMBODIMENTS OF THE INVENTION

Embodiments of the invention relate generally to hard disk drives and more particularly to a piezoelectric (PZT) microactuator.

BACKGROUND

A hard-disk drive (HDD) is a non-volatile storage device that is housed in a protective enclosure and stores digitally encoded data on one or more circular disks having magnetic surfaces (a disk may also be referred to as a platter). When an HDD is in operation, each magnetic-recording disk is rapidly rotated by a spindle system. Data is read from and written to a magnetic-recording disk using a read/write head which is positioned over a specific location of a disk by an actuator.

A read/write head uses a magnetic field to read data from and write data to the surface of a magnetic-recording disk. As a magnetic dipole field decreases rapidly with distance from a magnetic pole, the distance between a read/write head, which is housed in a slider, and the surface of a magnetic-recording disk must be tightly controlled. An actuator relies in part on a suspension's force on the slider and on the aerodynamic characteristics of the slider air bearing surface (ABS) to provide the proper distance between the read/write head and the surface of the magnetic-recording disk (the "flying height") while the magnetic-recording disk rotates.

Increasing areal density (a measure of the quantity of information bits that can be stored on a given area of disk surface) has led to the necessary development and implementation of secondary and even tertiary actuators for improved head positioning through relatively fine positioning, in addition to a primary voice coil motor (VCM) actuator which provides relatively coarse positioning. Some hard disk drives employ micro- or milli-actuator designs to provide second and/or third stage actuation of the recording head to enable more accurate positioning of the head relative to the recording track. Milli-actuators are broadly classified as actuators that move the entire front end of the suspension: spring, load beam, flexure and slider, and are typically used as second stage actuators. Microactuators are typically used as third stage actuators and are broadly classified as actuators that move only the slider, moving it relative to the suspension and load beam, or move only the read-write element relative to the slider body. A third stage actuator is used in conjunction with a first stage actuator (e.g., VCM) and a second stage actuator (e.g., milli-actuator) for more accurate head positioning.

Piezoelectric (PZT) based and capacitive micro-machined transducers are two types of microactuators that have been proposed for use with HDD sliders. Typical PZT transducers are designed as two cantilevers joined with a rigid body at the free ends, a structure which leads to a modestly high bandwidth of 20 kHz but which is very complicated to manufacture because the two cantilevers are fabricated using sand blasting techniques. In the case of capacitive micro-machined microactuators, the net displacement that can be achieved is relatively high but is offset in part by a low servo bandwidth due to a relatively low resonant frequency, often in the range of 5 kHz.

SUMMARY OF EMBODIMENTS OF THE INVENTION

Embodiments of the invention are directed towards a piezoelectric (PZT) microactuator which may be implemented, for example, for use as a third stage actuator in a hard disk drive. The described microactuator is fabricated from and comprises a single sheet, or block, of a piezoelectric material, with the top and bottom covered with an electrically conductive material to form the electrodes. The piezoelectric material is differential-poled so that one lateral portion is poled in one direction and another lateral portion is poled in the opposite direction. The piezoelectric material is poled by applying a large initial electrical field to the material so that all the individual dipole moments of the material align in the same direction within each respective portion.

Thus, when a drive voltage is applied between the top and bottom electrodes, one portion of the piezoelectric material expands while the other portion contracts, thereby providing a rotational movement. The direction (expansion or contraction) of each respective portion is determined by the direction of the applied voltage and the direction of poling.

A single sheet, differential-poled PZT microactuator configuration as described achieves a relatively high resonant frequency and thus high servo bandwidth, provides precise control of slider motion, and can be batch processed and poled which, therefore, provides a readily manufacturable component.

Embodiments discussed in the Summary of Embodiments of the Invention section are not meant to suggest, describe, or teach all the embodiments discussed herein. Thus, embodiments of the invention may contain additional or different features than those discussed in this section.

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIGS. 5A, 5C, 5E and 5G are plan views of stages of the manufacturing of a single sheet differential-poled piezoelectric microactuator, according to an embodiment of the invention; and FIGS. 5B, 5D, 5D(1), 5F and 5H are cross-sectional views of the stages of the manufacturing of the single sheet differential-poled piezoelectric microactuator, according to an embodiment of the invention.

DETAILED DESCRIPTION

Approaches to the configuration and the manufacturing process for a single sheet differential-poled piezoelectric microactuator are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of Illustrative Embodiments of the Invention

Figure 1:
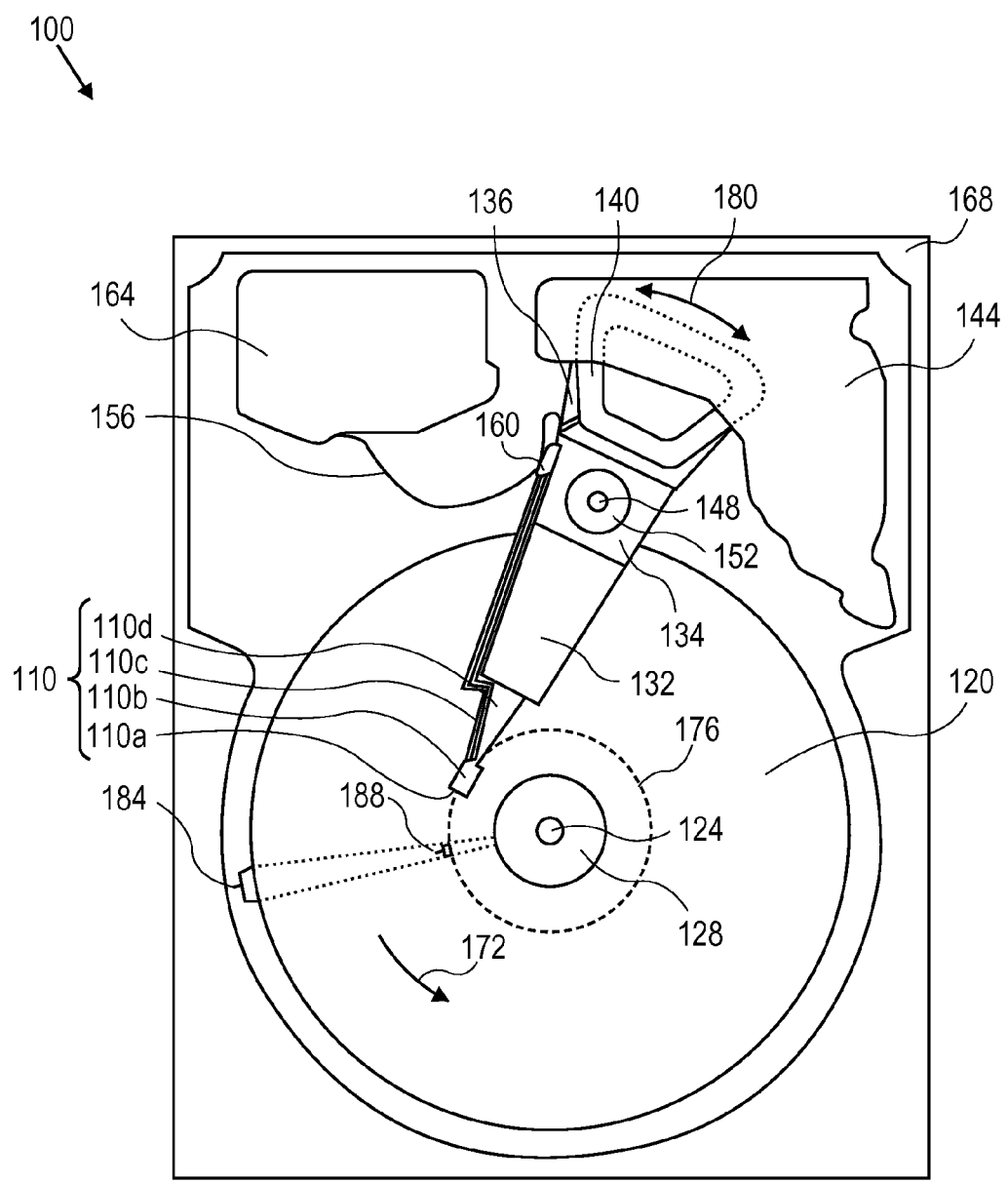
FIG. 1 is a plan view of an HDD, according to an embodiment of the invention.

Embodiments of the invention may be used in the context of the manufacturing and use of a magnetic writer for a hard-disk drive (HDD). In accordance with an embodiment of the invention, a plan view of a HDD 100 is shown in FIG. 1. FIG. 1 illustrates the functional arrangement of components of the HDD including a slider 110b that includes a magnetic-reading/recording head 110a. Collectively, slider 110b and head 110a may be referred to as a head slider. The HDD 100 includes at least one head gimbal assembly (HGA) 110 including the head slider, a lead suspension 110c attached to the head slider, and a load beam 110d attached to the lead suspension 110c. The HDD 100 also includes at least one magnetic-recording disk 120 rotatably mounted on a spindle 124 and a drive motor (not shown) attached to the spindle 124 for rotating the disk 120. The head 110a includes a write element and a read element for respectively writing and reading information stored on the disk 120 of the HDD 100. The disk 120 or a plurality (not shown) of disks may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134; and a stator 144 including a voice-coil magnet (not shown). The armature 136 of the VCM is attached to the carriage 134 and is configured to move the arm 132 and the HGA 110 to access portions of the disk 120 being mounted on a pivot-shaft 148 with an interposed pivot-bearing assembly 152. In the case of an HDD having multiple disks, or platters as disks are sometimes referred to in the art, the carriage 134 is called an "E-block," or comb, because the carriage is arranged to carry a ganged array of arms that gives it the appearance of a comb.

With further reference to FIG. 1, in accordance with an embodiment of the present invention, electrical signals, for example, current to the voice coil 140 of the VCM, write signal to and read signal from the head 110a, are provided by a flexible interconnect cable 156 ("flex cable"). Interconnection between the flex cable 156 and the head 110a may be provided by an arm-electronics (AE) module 160, which may have an on-board pre-amplifier for the read signal, as well as other read-channel and write-channel electronic components. The AE 160 may be attached to the carriage 134 as shown. The flex cable 156 is coupled to an electrical-connector block 164, which provides electrical communication through electrical feedthroughs (not shown) provided by an HDD housing 168. The HDD housing 168, also referred to as a casting, depending upon whether the HDD housing is cast, in conjunction with an HDD cover (not shown) provides a sealed, protective enclosure for the information storage components of the HDD 100.

With further reference to FIG. 1, in accordance with an embodiment of the present invention, other electronic components (not shown), including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the disk 120 that is affixed to the spindle 124 by the disk clamp 128; as a result, the disk 120 spins in a direction 172. The spinning disk 120 creates a cushion of air that acts as an air-bearing on which the air-bearing surface (ABS) of the slider 110b rides so that the slider 110b flies above the surface of the disk 120 without making contact with a thin magnetic-recording medium of the disk 120 in which information is recorded.

The electrical signal provided to the voice coil 140 of the VCM enables the head 110a of the HGA 110 to access a track 176 on which information is recorded. Thus, the armature 136 of the VCM swings through an arc 180 which enables the HGA 110 attached to the armature 136 by the arm 132 to access various tracks on the disk 120. Information is stored on the disk 120 in a plurality of stacked tracks (not shown) arranged in sectors on the disk 120, for example, sector 184. Correspondingly, each track is composed of a plurality of sectored track portions, for example, sectored track portion 188. Each sectored track portion 188 is composed of recorded data and a header containing a servo-burst-signal pattern, for example, an ABCD-servo-burst-signal pattern, information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

Single Sheet Differential-Poled Piezoelectric Microactuator

Figure 2A:
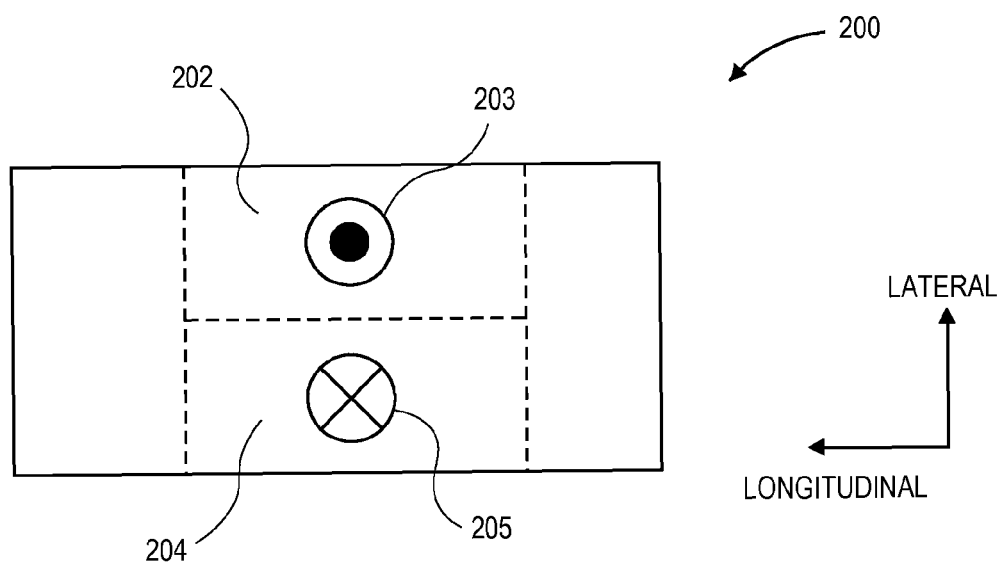
FIG. 2A is a plan view of a piezoelectric microactuator, according to an embodiment of the invention.

Embodiments of the invention relate to a single sheet, differential-poled piezoelectric (PZT) microactuator (also referred to as "third stage actuator") for high servo bandwidth and precise control of slider motion. FIG. 2A is a plan view of a piezoelectric microactuator and FIG. 2B is a side view of the piezoelectric microactuator of FIG. 2A, according to an embodiment of the invention.

Piezoelectric microactuator (PZT MA) 200 comprises a first lateral portion 202 and a second lateral portion 204, substantially centered about a longitudinal centerline axis. "Lateral portions" 202 and 204 are referred to as such because they are configured laterally with respect to a longitudinal centerline of PZT MA 200, as well as laterally with respect to a longitudinal axis of slider 302 (FIG. 3A) and a longitudinal axis of suspension 304 (FIG. 3B) along the length of each. Further, the opposing terms "top" and "bottom, "over" and "under", "above" and "below", "upper" and "lower", and the like, if used herein are used relatively but arbitrarily and not in an absolute sense because PZT MA 200 does not necessarily have a true top or bottom.

Lateral portion 202 is poled in a certain direction: "up", or out of the page, as depicted as poling 203 of FIG. 2A. By contrast, lateral portion 204 is poled in the opposite direction as lateral portion 202: "down", or into the page, as depicted as poling 205 of FIG. 2A. The poling 203 and 205 directions depicted in FIG. 2A are arbitrary and could be reversed, just so long as the poling directions are opposite. Poling 203 and poling 205 are formed by applying a large electric field to the PZT material so that all the individual dipole moments of the material align in the same direction for each of the respective polings 203 and 205 and, likewise, for each of the corresponding lateral portions 202 and 204.

Figure 2B:
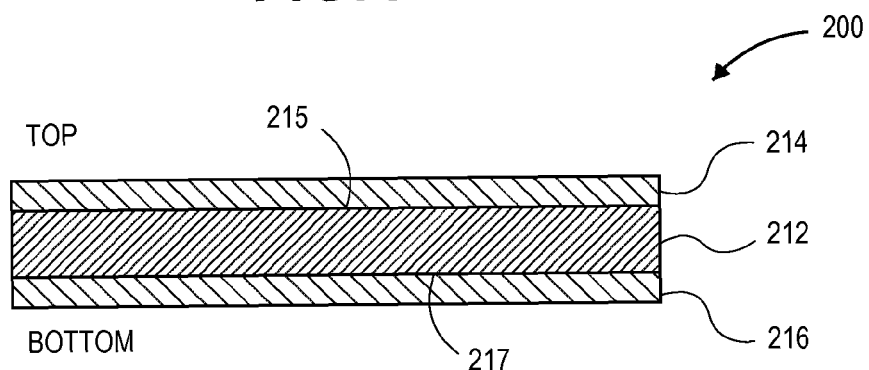
FIG. 2B is a side view of the piezoelectric microactuator of FIG. 2A, according to an embodiment of the invention.

Referring to FIG. 2B, the side view of PZT MA 200 shows that PZT material 212 has atop surface 215 and a bottom surface 217. The top surface 215 of PZT material 212 is covered (e.g., coated or deposited) with a top, or first, conductive electrode layer 214. Similarly, the bottom surface 217 of PZT material 212 is covered (e.g., coated or deposited) with a bottom, or second, conductive electrode layer 216. Each of the electrode layer 214 and electrode lay 16 is electrically coupled to the PZT material 212 to drive the actuation of the PZT MA 200.

Figure 3A:
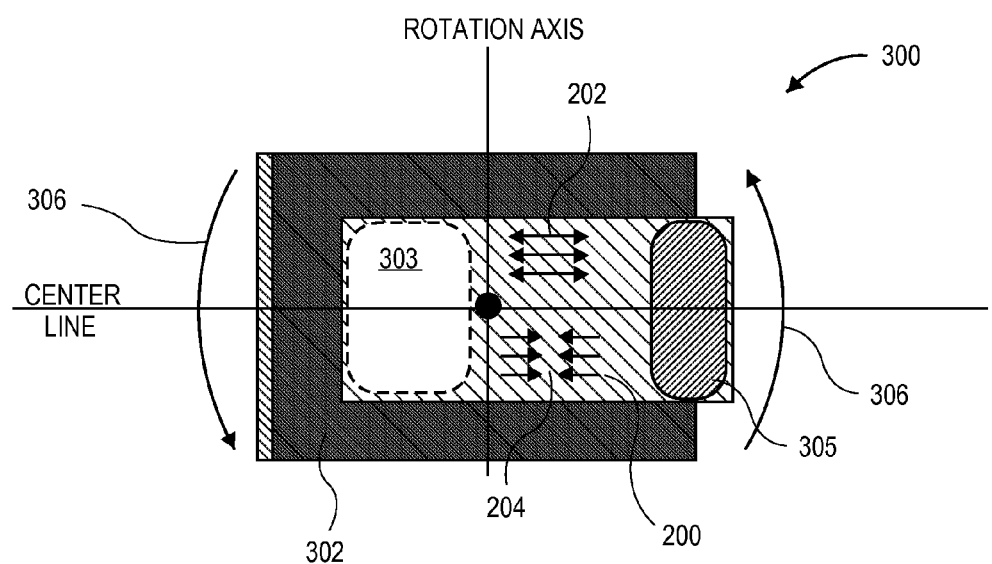
FIG. 3A is a plan view of a piezoelectric microactuator and slider assembly, according to an embodiment of the invention.
Figure 3B:
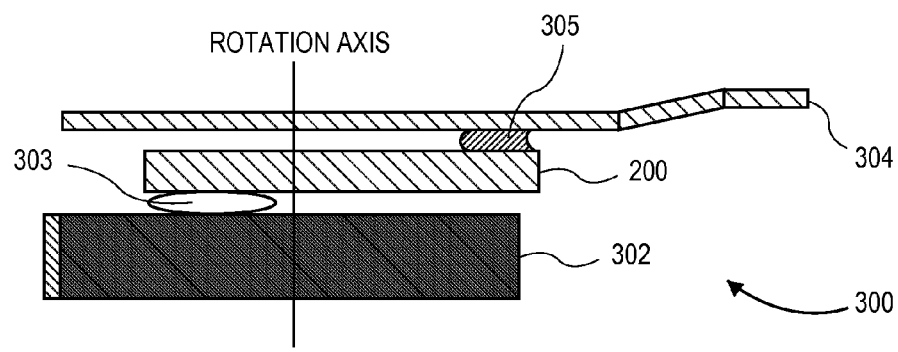
FIG. 3B is a side view of the piezoelectric microactuator and slider assembly of FIG. 3A, according to an embodiment of the invention.

FIG. 3A is a plan view of a piezoelectric microactuator and slider assembly, and FIG. 3B is a side view of the piezoelectric microactuator and slider assembly of FIG. 3A, according to an embodiment of the invention. FIGS. 3A and 3B illustrate the assembly 300 of the PZT MA 200 and slider 302, as well as the operation of the assembly 300.

The PZT MA 200 is fixed to the suspension 304 via affixing means 305. For example, PZT MA 200 may be fixed to the suspension 304 by soldering or using an adhesive. Slider 302 is coupled to PZT MA 200, for example, using an adhesive 303 such as a soft epoxy. The location at which PZT MA 200 is fixed to the suspension 304, and thus the location of affixing means 305, may vary from implementation to implementation. Similarly, the location at which slider 302 is coupled to PZT MA 200, and thus the location of adhesive 303, may vary from implementation to implementation. For example, the location of affixing means 305 and adhesive 303 as illustrated in FIGS. 3A and 3B are shown as an example, and may be reversed such that PZT MA 200 is fixed to the suspension at the leading edge side (left-hand side of FIGS. 3A and 3B) and the slider 302 is fixed to the PZT MA 200 at the trailing edge side (right-hand side of FIGS. 3A and 3B).

Slider 302 may be coupled to PZT MA 200 in such a manner that the mass moment of the assembly 300 is balanced about the axis of rotation of the assembly 300 relative to the suspension 304.

When drive voltage is applied between the top electrode (e.g., electrode layer 214 of FIG. 2B) and the bottom electrode (e.g., electrode layer 216 of FIG. 2B), one lateral portion of the PZT MA 200 expands and the other lateral portion of the PZT MA 200 contracts. The direction of movement of each respective lateral portion 202 and 204 (FIG. 2A), i.e., expansion or contraction, is determined by the applied voltage relative to the direction of poling of each respective lateral portion 202 and 204. That is, if the applied voltage direction and poling voltage direction are the same, then that lateral portion of the PZT MA 200 contracts in the longitudinal direction. Similarly, if the applied voltage direction and poling voltage direction are opposite, then that lateral portion of the PZT MA 200 expands in the longitudinal direction. Thus, because each electrode layer 214 and 216 is in electrical coupling with both lateral portions 202 and 204, a single applied voltage causes one lateral portion to contract and the other lateral portion to expand simultaneously, thereby generating a bending motion of the PZT MA 200 about the centerline, depicted as moment 306 in FIG. 3A. This bending motion causes rotational movement of the slider 302. Further, the magnitude of the expansion/contraction is roughly proportional to the drive voltage, so that the motion of the slider 302 can be precisely controlled by applying accurate drive voltage.

Manufacturing a Single Sheet Differential-Poled Piezoelectric Microactuator

Figure 4:
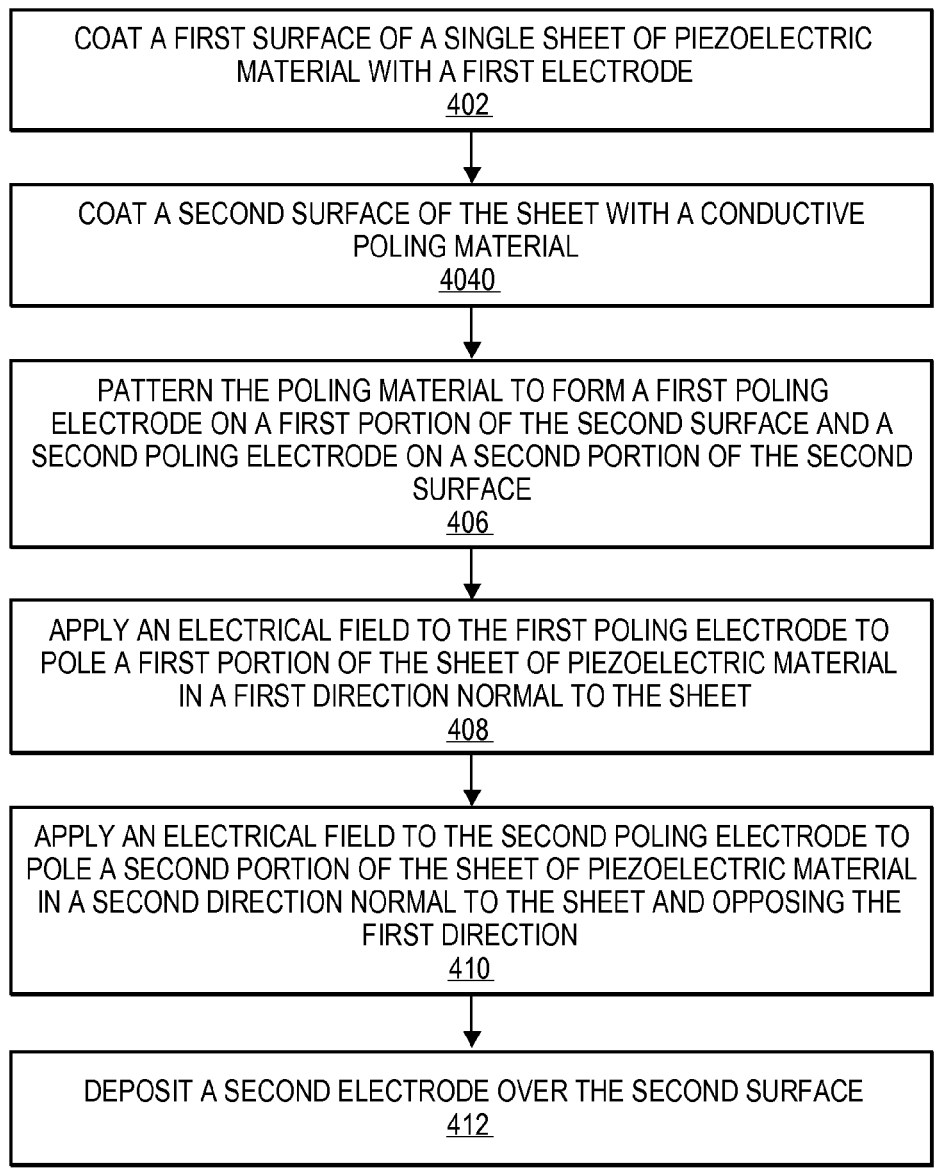
FIG. 4 is a flow diagram illustrating a process for manufacturing a single sheet differential-poled piezoelectric microactuator, according to an embodiment of the invention.

FIG. 4 is a flow diagram illustrating a process for manufacturing a single sheet differential-poled piezoelectric microactuator, according to an embodiment of the on. FIGS. 5A, 5C, 5E and 5G are plan views of stages of the manufacturing of a single sheet differential-poled piezoelectric microactuator, and FIGS. 5B, 5D, 5D(1), 5F and 5H are cross-sectional views of the stages of the manufacturing of the single sheet differential-poled piezoelectric microactuator, according to an embodiment of the invention. Having introduced the concept of a single sheet differential-poled piezoelectric microactuator, in reference to piezoelectric microactuator 200 of FIGS. 2A and 2B, a method for manufacturing such a component is now described with reference to FIG. 4 and all the FIGS. 5A-5H.

At block 402, a first surface of a piezoelectric material is coated with a first electrode. Referring to FIG. 5A and FIG. 5B, for example, a very thin sheet of piezoelectric material 512 is coated with conductive material 516 (such as Cr, Au or Al) on one side (e.g., the bottom). According to an embodiment, the thin sheet of piezoelectric material from which the microactuator is manufactured is approximately 100 μm thick, so that the head slider assembly can be safely loaded on and unloaded from a toad/unload ramp.

At block 404, a second surface of the piezoelectric material is coated with a conductive poling material. Referring to FIG. 5B, for example, piezoelectric material 512 is coated with conductive material 514 on the other side (e.g., the top).

At block 406, the poling material is patterned to form a first poling electrode on a first portion of the second surface and a second poling electrode on a second portion of the second surface. Referring to FIG. 5C and FIG. 5D, for example, the poling material 514 is patterned to form a plurality of poling electrodes 520 and a plurality of poling electrodes 522.

At block 408, an electrical field is applied to the first poling electrode to pole a first portion of the sheet of piezoelectric material in a first direction normal to the sheet, and at block 410, an electrical field is applied to the second poling electrode to pole a second portion of the sheet of piezoelectric material in a second direction normal to the sheet and opposing the first direction. Referring to FIG. 5D(1), for example, a high voltage electrical field 524 is applied to poling electrodes 520 to pole the adjacent piezoelectric material 512 in one direction (block 408), and an opposite direction high voltage electrical field 526 is applied to poling electrodes 522 to pole the adjacent piezoelectric material 512 in the other direction (block 410). Because alternate rows of poling electrodes are electrically connected, batch poling of an entire wafer is facilitated by the application of only two respective high voltage electrical fields in opposing directions to the top 528 and bottom 516 electrodes.

At block 412, a second electrode is deposited over the second surface. Referring to FIG. 5E and FIG. 5F, for example, the actuation electrode 528 is deposited over piezoelectric material 512, which in an embodiment, includes depositing electrode 528 over the poling electrodes 520 and 522. Alternatively, the poling electrodes 520 and 522 may be removed (e.g., by etching) prior to depositing the actuation electrode 528.

Finally, the wafer assembly is diced to obtain the separate piezoelectric microactuators of the desired dimensions, such as microactuators 530a, 530b, 530c shown n FIG. 5G and FIG. 5H. Each of microactuators 530a, 530b, 530c comprises differential-poled piezoelectric material 512 coupled to actuation electrodes 528 and 516, to which drive voltage can be applied to drive the fine rotational movement of the microactuator and slider.

The piezoelectric microactuator as configured herein provides a third stage actuator enabling fine precision movement of an attached head slider and having a relatively high resonant frequency (e.g., greater than 100 kHz). This assists in achieving a relatively high servo bandwidth microactuator, which enables greater operation in the linear region of its transfer function and, therefore, more predictable and stable operation over a wider operational regime. Further, such a microactuator can be readily batch processed and poled at the wafer level, and does not require complicated fabrication steps such as sand blasting, thereby reducing manufacturing time in comparison with prior microactuator designs.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A piezoelectric microactuator configured for third stage actuation in a hard disk drive, said microactuator comprising:
    a single sheet of piezoelectric material having a top surface, an opposing bottom surface, a first lateral portion and a second lateral portion, wherein the first lateral portion is poled in a first direction and the second lateral portion is poled in an opposing second direction; and
    a single first actuation electrode layer electrically coupled with the top surface and a single second actuation electrode layer electrically coupled with the bottom surface.

2. The piezoelectric microactuator of claim 1,
    wherein a drive voltage applied to the first electrode layer in the same direction in which the first lateral portion is poled causes the first lateral portion to contract and the second lateral portion to expand; and
    wherein a drive voltage applied to the first electrode layer in the opposite direction in which the first lateral portion is poled causes the first lateral portion to expand and the second lateral portion to contract.

3. The piezoelectric microactuator of claim 2,
    wherein the first lateral portion and second lateral portion are configured to expand and contract in a longitudinal direction.

4. The piezoelectric microactuator of claim 1,
    wherein the first direction and the second direction are substantially normal to the top surface and to the bottom surface.

5. The piezoelectric microactuator of claim 1, further comprising:
    first affixing means coupling said microactuator to a head slider and second affixing means mounting said microactuator to a suspension for rotating said head slider relative to said suspension.

6. A hard disk drive, comprising:
    a head slider comprising a magnetic write head;
    a magnetic-recording disk rotatably mounted on a spindle;
    a voice coil motor configured to coarsely move the head slider to access portions of the magnetic-recording disk;
    a microactuator mounted on a suspension and attached directly to said head slider to finely move the head slider to access portions of the magnetic-recording disk;
    wherein the microactuator comprises:
        a single sheet of piezoelectric material having a top surface, an opposing bottom surface, a first lateral portion and a second lateral portion, wherein the first lateral portion is poled in a first direction and the second lateral portion is poled in an opposing second direction, and
        a single first actuation electrode layer electrically coupled with the top surface and a single second actuation electrode layer electrically coupled with the bottom surface; and
    a microactuator drive circuit configured to apply drive voltage to the first actuation electrode layer and the second actuation electrode layer to drive the microactuator.

7. The hard disk drive of claim 6,
    wherein the drive voltage applied to the first and second actuation electrode layers in the same direction in which the first lateral portion is poled causes the first lateral portion to contract and the second lateral portion to expand; and
    wherein a drive voltage applied to the first and second actuation electrode layers in the opposite direction in which the first lateral portion is poled causes the first lateral portion to expand and the second lateral portion to contract.

8. The hard disk drive of claim 7,
    wherein the first lateral portion and second lateral portion are configured to expand and contract in a longitudinal direction of the suspension.

9. The hard disk drive of claim 6,
    wherein the first direction and the second direction are substantially normal to the top surface and to the bottom surface.

10. A method for manufacturing a piezoelectric microactuator for a hard disk drive, the method comprising:
    coating a first surface of a single sheet of piezoelectric material with a first electrode;
    coating a second surface of the sheet of piezoelectric material with a conductive poling material;
    patterning the conductive poling material to form a first poling electrode on a first portion of the second surface of the sheet of piezoelectric material and a second poling electrode on a second portion of the second surface of the sheet of piezoelectric material;
    applying an electrical field to the first poling electrode to pole the first portion in a first direction normal to the sheet of piezoelectric material;
    applying an electrical field to the second poling electrode to pole the second portion in a second direction normal to the sheet of piezoelectric material and opposing the first direction; and
    depositing a second electrode over the second surface of the sheet of piezoelectric material.

11. The method of claim 10, wherein the coating, patterning, applying and depositing are performed on the sheet of piezoelectric material to fabricate a plurality of piezoelectric microactuators simultaneously, and wherein the method further comprises:
    dicing the sheet of piezoelectric material to form the plurality of piezoelectric microactuators.

* * * * *